(12) United States Patent
Itoh et al.

(10) Patent No.: US 7,385,436 B2
(45) Date of Patent: Jun. 10, 2008

(54) FULLY DEPLETED SILICON ON INSULATOR SEMICONDUCTOR DEVICES

(75) Inventors: Kiyoo Itoh, Higashikurume (JP); Ryuta Tsuchiya, Hachioji (JP); Takayuki Kawahara, Higashiyamato (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/714,844

(22) Filed: Mar. 7, 2007

(65) Prior Publication Data

US 2007/0152736 A1   Jul. 5, 2007

Related U.S. Application Data

(63) Continuation of application No. 11/362,172, filed on Feb. 27, 2006.

(30) Foreign Application Priority Data

Jul. 11, 2005   (JP) .............................. 2005-201054

(51) Int. Cl.
*H03K 3/01* (2006.01)
(52) U.S. Cl. .................. 327/534; 327/531; 327/535
(58) Field of Classification Search ................ 327/365, 327/534, 531, 535, 597
See application file for complete search history.

(56) References Cited

U.S. PATENT DOCUMENTS

| | | | |
|---|---|---|---|
| 5,646,058 A | 7/1997 | Taur et al. | |
| 5,736,435 A | 4/1998 | Venkatesan et al. | |
| 5,969,564 A * | 10/1999 | Komatsu et al. | 327/534 |
| 6,043,536 A | 3/2000 | Numata et al. | |
| 6,049,110 A | 4/2000 | Koh | |
| 6,239,649 B1 | 5/2001 | Bertin et al. | |
| 6,365,465 B1 | 4/2002 | Chan et al. | |
| 6,919,647 B2 * | 7/2005 | Hackler et al. | 257/250 |
| 7,091,069 B2 * | 8/2006 | Doris et al. | 438/149 |
| 2002/0105039 A1 | 8/2002 | Hanafi et al. | |
| 2003/0001658 A1* | 1/2003 | Matsumoto | 327/534 |
| 2005/0276094 A1* | 12/2005 | Yamaoka et al. | 365/154 |

FOREIGN PATENT DOCUMENTS

EP   0 816 903 A1   7/1997

OTHER PUBLICATIONS

Masanao Yamaoka et al., "Low Power SRAM Menu for SOC Application Using Yin-Yang-Feedback Memory Cell Technology", 2004 Symposium on VLSI Circuits Digest of Technical Papers, (Jun. 2004), pp. 288-291.

(Continued)

*Primary Examiner*—Charles D. Garber
*Assistant Examiner*—John W Poos
(74) *Attorney, Agent, or Firm*—Reed Smith LLP; Stanley P. Fisher, Esq.; Juan Carlos A. Marquez, Esq.

(57) ABSTRACT

A CMOS circuit in low-voltage implementation, low power-consumption implementation, high-speed implementation, or small-size implementation. In a circuit which uses a FD-SOI MOST where a back gate is controlled by a well, voltage amplitude at the well is made larger than input-voltage amplitude at the gate. Alternatively, the circuit is modified into a circuit which uses a MOST that changes dynamically into an enhancement mode and a depletion mode.

7 Claims, 13 Drawing Sheets

OTHER PUBLICATIONS

Masanao Yamaoka et al., "Dynamic-Vt, Dual-Power-Supply SRAM Cell Using D2G-SOI for Low-Power SoC Application", 2004 IEEE International SOI Conference, (Oct. 2004), pp. 109-111.

R. Tsuchiya et al., "Silicon on Thin Box: A New Paradigm of the SMOSFET for Low-Power and High-Performance Application Featuring Wide-Range Back-Bias Control", IDEM Dig. Tech. Papers (Dec. 2004), pp. 631-634.

Kuo, J.B. et al., "Low-Voltage SOI CMOS VLSI Devices and Circuits", 2001, John Wiley & Sons, Inc., Munich, XP002463400, pp. 19-23, 158-165, 232-245.

Extended European Search Report for 06003938.5-2203 dated Feb. 6, 2008.

* cited by examiner

ND-US 7,385,436 B2

FULLY DEPLETED SILICON ON INSULATOR SEMICONDUCTOR DEVICES

CROSS-REFERENCES TO RELATED APPLICATIONS

This application is a Continuation of U.S. application No. 11/362,172 filed on Feb. 27, 2006. Priority is claimed based on U.S. application No. 11/362,172 filed on Feb. 27, 2006, which claims the priority of Japanese Patent No. 2005-201054 filed Jul. 11, 2005, the entire disclosure of which is incorporated herein by reference.

BACKGROUND OF THE INVENTION

The present invention relates to a semiconductor device in which CMOS circuits are integrated on a semiconductor chip. More specifically, it relates to a circuit scheme and a device scheme which allow a reduction in power consumption, operating voltage, or area of a CMOS integrated circuit device.

DESCRIPTION OF THE RELATED ART

As is well known, in a MOS transistor (MOST), the operating voltage $V_{DD}$ decreases as the patterning of the MOST becomes finer. This results in an increase in the variation in threshold voltage ($V_T$) of the MOST. For example, FIG. 10A illustrates the relationship between $V_{pp}$-$V_{T0}$ and fine-patterning process technology. Here, $V_{DD}$-$V_{T0}$ denotes effective gate voltage (i.e., gate-over drive voltage) of the MOST, and $V_{T0}$ denotes average $V_T$ of the MOST. The expected values according to ITRS 2001 (: International Technology Roadmap for Semiconductors, 2001 ed.) are added to FIG. 10A. In this drawing, MPU and LPSOC denote a microprocessor and a low-power System On a Chip, respectively. Here, a lower-limit exists to this $V_{T0}$. By the way, sub-threshold current (i.e., a kind of leakage current) which flows in the MOST at non-conduction time increases exponentially in accompaniment with a decrease in $V_T$. In order to suppress this exponential increase, the above-described lower-limit is given. This lower-limit value, which is substantially irrelevant to the fine patterning of the MOST, is determined by an upper-limit value of the leakage current on the chip. Usually, this lower-limit value is equal to an order of 0.2 V to 0.3 V in the case of a high-speed chip, and an order of 0.5 V in the case of a low-power chip. Accordingly, as illustrated in the drawing, the effective gate voltage quickly lowers in accompaniment with the fine patterning. This results in a rapid lowering in operation speed of MOSTs within a load-driving circuit. This is because the operation speed of a MOST is substantially inverse proportional to the effective gate voltage. For example, in the case of the high-speed chip, $V_{DD}$ lowers in accompaniment with the fine patterning, thus getting closer to 0.3 V. At this time, the circuit speed is delayed rapidly.

The increase in the variation ($\Delta V_T$) in the threshold voltage $V_T$ in accompaniment with the finer patterning is also a serious problem. This is because the operation speed of a MOST within a chip is becoming increasingly varied, thereby making the reliable chip design difficult to accomplish. FIG. 10B illustrates a drawing issued in M. Yamaoka et al., "Low Power SRAM Menu for SOC Application Using Yin-Yang-Feedback Memory Cell Technology", Symp. VLSI Circuits Dig., pp. 288 to 291, June 2004. As illustrated in the drawing, standard deviation a of the variation in threshold voltage $V_T$ increases in accompaniment with finer patterning of the MOST. In the drawing, $\sigma_{int}$ denotes standard deviation of the so-called intrinsic $V_T$ which is determined by a variation in the number of impurity atoms within channel of the MOST or a variation in the position thereof, while $\sigma_{ext}$ denotes standard deviation of the so-called extrinsic $V_T$ which is determined by a variation in size of the channel or the like. The entire $V_T$ variation $\sigma$ is determined by both of the variations. Even in the case where the fine-patterning technology employed is of an order of 90 nm, $\sigma$ attains to as much as an order of 30 mV. The design of a single chip needs to be performed by taking into consideration the $V_T$ variation ($\Delta V_T$) of an order of $5\sigma$, and this value attains to as much as 150 mV. Under this variation, the effective gate voltage of each MOST within the single chip, which is represented by $V_{DD}$-($V_{T0}$+$\Delta V_T$), turns out to be significantly varied. For example, in the case where $V_{T0}$=0.3 V and $\Delta V_T$=150 mV, when $V_{DD}$ becomes equal to 0.45 V, driving current for each MOST becomes equal to 0, and thus the circuit speed diverges to infinity.

Conventionally, two methods have been proposed in order to suppress the above-described occurrences of the low operation-speed and the operation-speed variation caused by the finer patterning and the low-voltage implementation. One method is development of a MOST which is capable of making $\Delta V_T$ smaller. The other method is development of a circuit which allows $V_T$ to be dynamically changed depending on the operation state. Namely, this circuit is a one which, at OFF time, maintains $V_T$ at a constant magnitude in order to suppress the sub-threshold current, and which, at ON time, makes $V_T$ smaller in order to make the effective gate voltage larger. As will be explained below, the use of a fully-depleted double-gate SOI (: Silicon-On-Insulator) (hereinafter, referred to as "FD-SOI") MOST makes it possible to simultaneously satisfy these two conditions. The reasons for this are as follows: Namely, as indicated in FIG. 10B, the FD-SOI structure itself allows reductions in the variation in the threshold voltage $V_T$. Moreover, taking advantage of this FD-SOI structure in a circuit-mannered configuration makes it possible to implement the dynamic $V_T$ as is described above.

The detailed structure and characteristics of the FD-SOI MOST are described in R. Tsuchiya et al., "Silicon on Thin Box: A New Paradigm of The CMOSFET for Low-Power and High-Performance Application Featuring Wide-Range Back-Bias Control", IEDM Dig. Tech. Papers. pp. 631-634, December 2004. The details of this structure will be explained hereinafter. FIG. 11A, FIG. 11B, and FIG. 11C are an A-A cross-sectional view and a plan view of an N-channel MOST (NMOST) and a P-channel MOST (PMOST), and a B-B cross-sectional view of the NMOST, respectively. Also, FIG. 12A and FIG. 12B illustrate an equivalent circuit to the NMOST and a one to the PMOST, respectively. Incidentally, FIG. 11C indicates an example where the gate and the well are connected to each other. The reference numerals denote the following configuration components: 20 denotes a metal-silicide (such as NiSi) gate electrode, 3 denotes a single-crystal semiconductor thin film (i.e., SOI layer), 13 and 14 denote junction-capacitance-reducing n-type impurity diffusion layers, 8 denotes a high-concentration n-type impurity ultra-thin source diffusion layer, 9 denotes a high-concentration n-type impurity ultra-thin drain diffusion layer, 4 denotes a BOX (: Buried OXide) layer, 25 and 26 denote threshold-voltage control diffusion layers (i.e., well layers), and the like. The feature of this MOST is as follows: Namely, the threshold voltage $V_T$ can be controlled based on type of the gate material, concentration of the well layer under the BOX layer, and voltage to be applied to the well layer. In the actual MOST, channel length (Lg) is equal to 100 nm or less, the gate material is, e.g., the metal silicide such as nickel silicide (NiSi), thickness of the SOI layer which allows the MOST to be formed is equal to 20 nm or less, thickness of the BOX layer is equal to 10 nm or less, the concentration of the well layer located under the BOX layer is equal to an order of $10^{16}$ cm$^{-3}$ to $10^{18}$ cm$^{-3}$. As illustrated in FIG. 10B, the employment of the thin BOX film or the like makes it possible to reduce the variation in $V_T$ of the FD-SOI MOST down to 20% or less in the conventional bulk structure.

The above-described double-gate MOST structure can be regarded as a single MOST which results from connecting an upper MOST and a lower MOST in parallel. Here, in the lower MOST, the well layer becomes a gate, and the BOX layer becomes a gate insulating film. Accordingly, changing the well voltage in the lower MOST makes it possible to significantly change the entire threshold voltage $V_T$ of the double-gate MOST. This is because the well layer is insulated from the other components and thus the well voltage can be significantly changed without causing pn-junction leakage current to occur. FIG. 13A and FIG. 13B illustrate a conventional circuit which utilizes this characteristic. For example, in the well-known CMOS inverter illustrated in FIG. 13A, the gates and the wells are directly connected to each other as is illustrated in FIG. 13B. This direct connection allows $V_T$ to be dynamically changed depending on the circuit input, i.e., the gate voltage $V_{DD}$ of the MOST. Namely, in the NMOST, at the input voltage at which the NMOST is switched OFF (i.e., 0 V), the well voltage becomes equal to 0 V, which is small. As a result, $V_T$ becomes larger. Meanwhile, at the input voltage at which the NMOST is switched ON (i.e., $V_{DD}$), the well voltage becomes higher. As a result, $V_T$ becomes smaller. Here, $V_T$ is selected in advance as being large enough so that the sub-threshold current at the OFF time will become smaller than a tolerance value. Then, at the ON time, the effective gate voltage will become larger by the amount by which $V_T$ has become smaller. This allows implementation of the high-speed operation of the NMOST. An example where the MOST connected in this way is applied to a SRAM (: Static Random-Access Memory) cell is disclosed in M. Yamaoka et al., "Dynamic-Vt, Dual-Power-Supply SRAM Cell using D2G-SOI for Low-Power SoC Application", Int'l SOI Conf. Dig. Tech. Papers. pp. 109-111, October 2004.

SUMMARY OF THE INVENTION (1) In the conventional circuit, lowering the $V_{DD}$ results in a lowering in the effect of the dynamic $V_T$. The reasons for this are as follows: Namely, since the gate and the well are directly connected to each other, if the input voltage $V_{DD}$ becomes smaller, the change in the well voltage also becomes smaller, and thus the change in $V_T$ becomes smaller. Moreover, since the circuit is operated by the single voltage $V_{DD}$, it is impossible to use another voltage which would compensate for adverse influences caused by the lowering in $V_{DD}$.

(2) In the conventional circuit as well, the proposals up to the present have been limited to the application to the SRAM cell. The reason for this is as follows: Namely, in the circuit where the gates and the wells are directly connected to each other, factors such as the operation conditions and a limit to the low-voltage implementation have been not clarified in relation to the device characteristics of the FD-SOI MOST.

It is an object of the present invention to clarify the relations therebetween, and, based on this clarification, to provide effective device structures and circuit operation conditions, or novel low-voltage circuits.

According to the present invention, voltage amplitude at a well is made larger than input-voltage amplitude at a gate. Alternatively, the voltage amplitude at the well is made larger than voltage amplitude at a drain or voltage amplitude at a source. Alternatively, voltage amplitudes at wells within a plurality of circuits are set at mutually different values. Alternatively, the circuit is operated by multi voltages. Alternatively, the circuit is modified into a circuit which uses MOSTs that change dynamically into an enhancement mode and a depletion mode. Alternatively, there is provided a new circuit which, at input stage of a differential input circuit, uses a MOST where the gate and the well are directly connected to each other.

According to the present invention, it becomes possible to accomplish low-voltage implementation, low power-consumption implementation, high-speed implementation, or small-size implementation of a CMOS circuit.

Other objects, features and advantages of the invention will become apparent from the following description of the embodiments of the invention taken in conjunction with the accompanying drawings.

DESCRIPTION OF THE EMBODIMENTS

Figure 1:
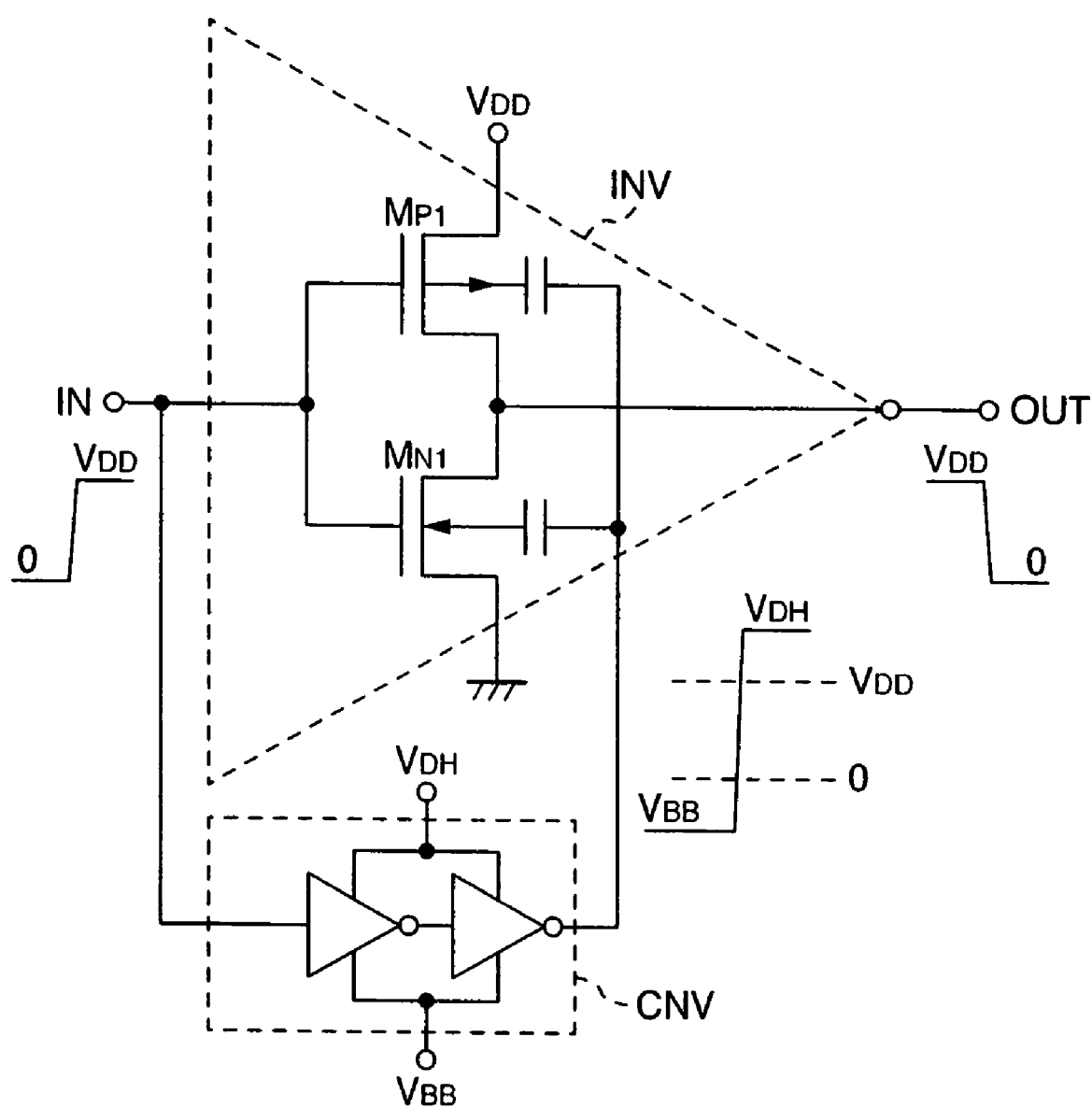
FIG. 1 is a schematic diagram of a CMOS inverter to which the present invention is applied.

Hereinafter, referring to the drawings, the explanation will be given below concerning the present invention.

Embodiment 1

FIG. 1 illustrates a CMOS inverter circuit which is a first embodiment of the present invention. A first circuit includes, e.g., an inverter INV, and a second circuit includes, e.g., a converter CNV for controlling well voltages with large voltage amplitudes. The second circuit is a sub-circuit. This sub-circuit drives comparatively small well capacities of MOSTs within the first circuit, and thus is easy to design into small-size, high-speed, and low power-consumption implementation. In contrast thereto, the first circuit is a main-circuit. This main-circuit must generically drive large load capacities, and thus cannot help being formed into large-area, low-speed, and large power-consumption implementation. Consequently, adding the second circuit to the first one results in exertion of only a small influence on the entire area, speed, and power consumption.

Figure 2:
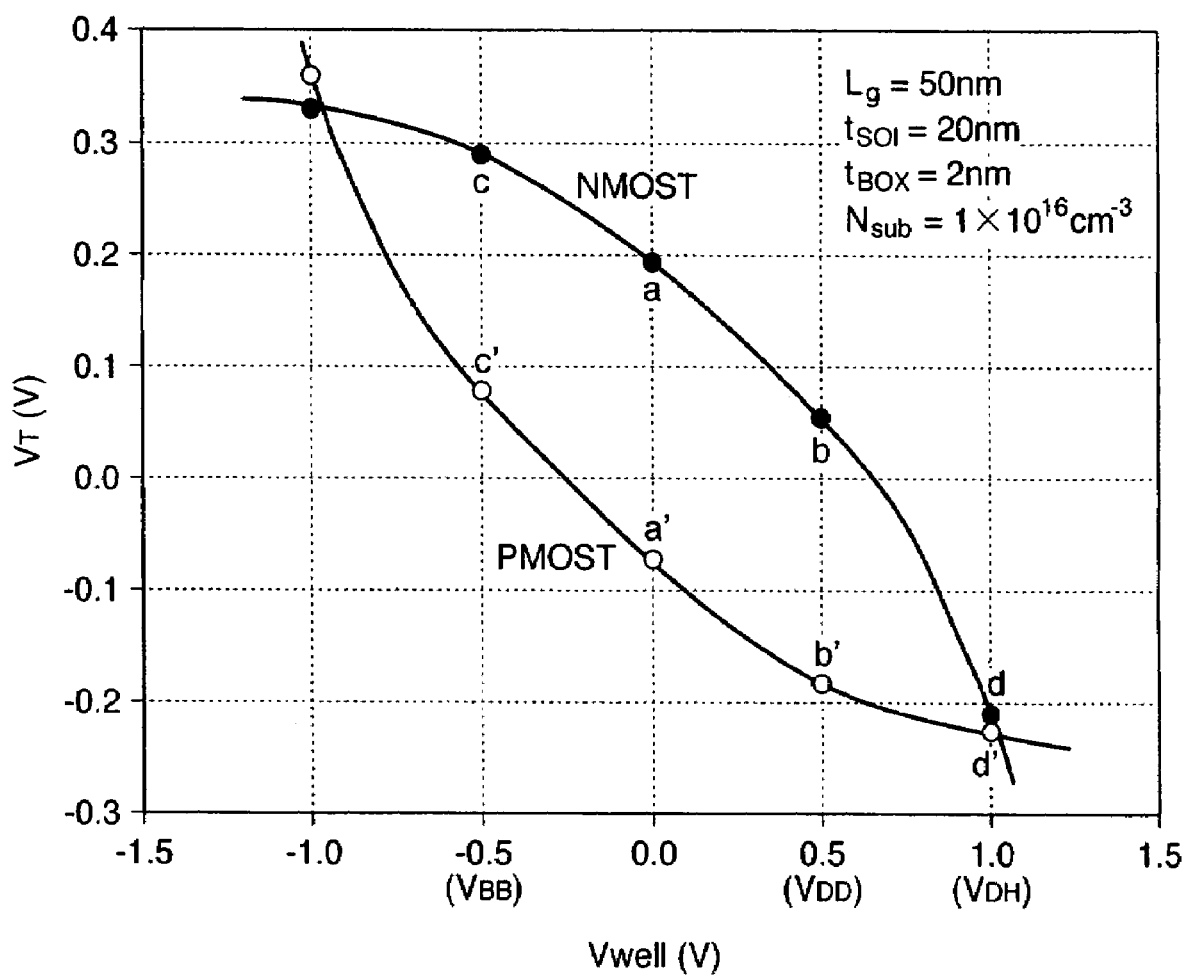
FIG. 2 is a characteristics diagram of transistors used in the present invention, where $L_g$, $t_{SOI}$, $t_{BOX}$, and $N_{sub}$ denote gate length of the MOSTs, film thickness of a SOI layer, film thickness of a BOX layer, and impurity concentration of a well layer under the BOX layer, respectively.
Figure 11A:
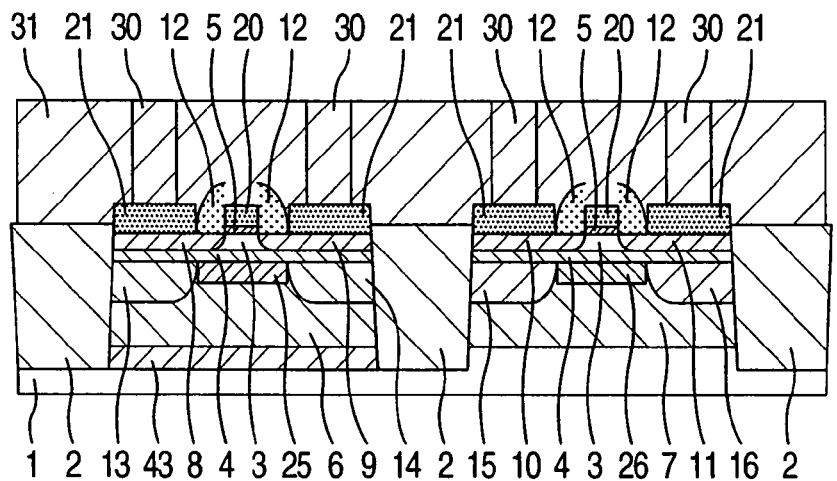
FIG. 11A, FIG. 11B, and FIG. 11C are the cross-sectional views and the plan view of a conventional FD-SOI MOS transistor.
Figure 11B:
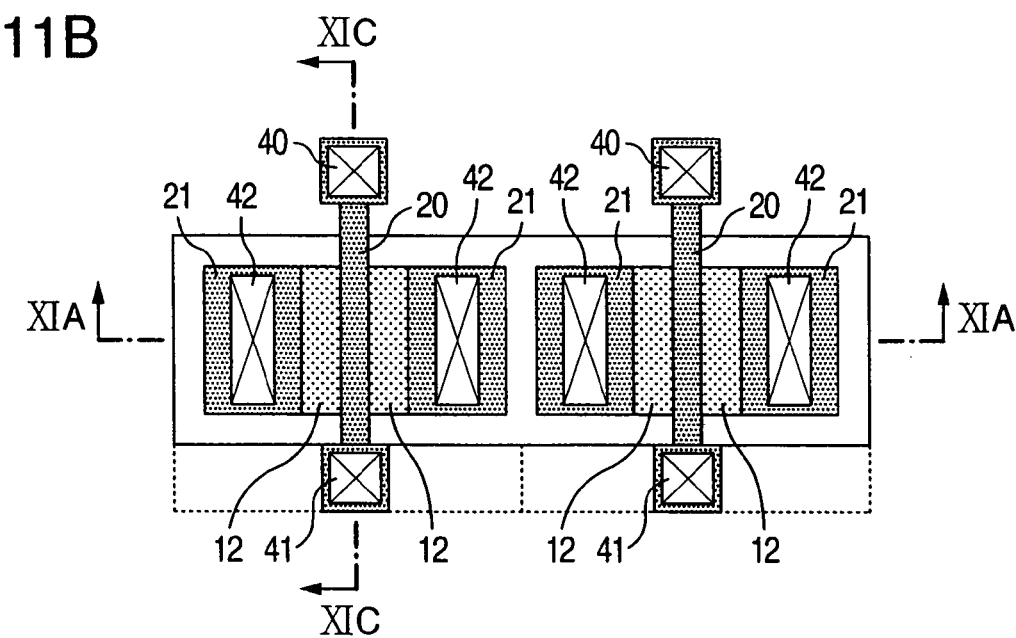
Figure 11C:
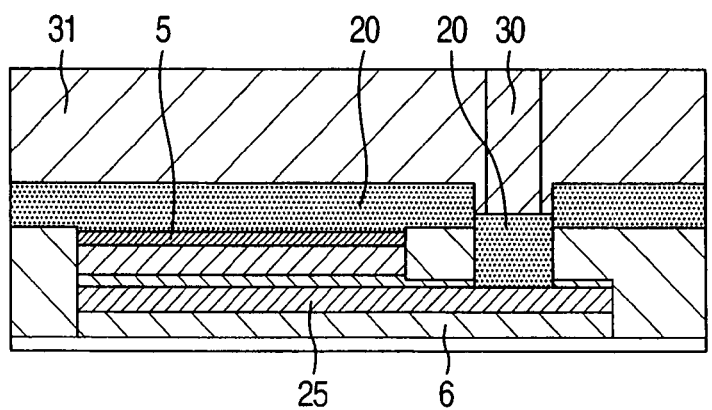
Figure 12A:
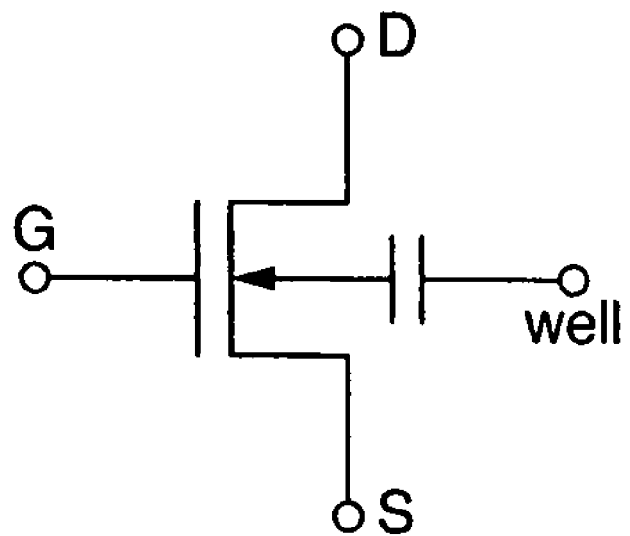
FIG. 12A and FIG. 12B illustrate a equivalent circuits to a conventional FD-SOI MOS transistor.
Figure 12B:
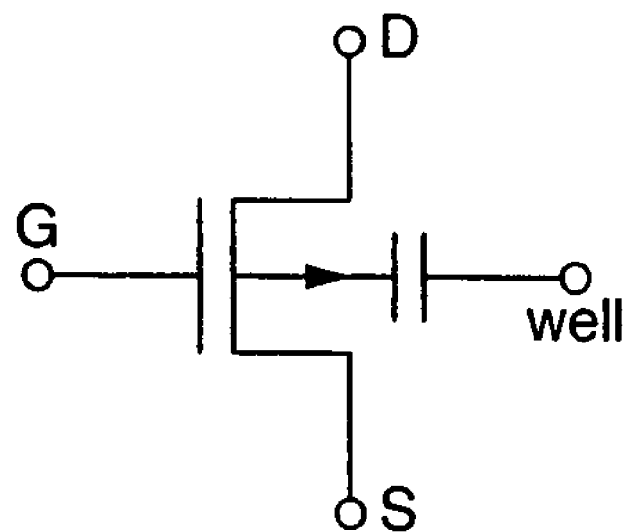

A PMOST ($M_{P1}$) and an NMOST ($M_{N1}$) are the FD-SOI MOST illustrated in FIG. 11 and FIG. 12. FIG. 2 illustrates the relationship of the threshold voltages $V_T$ of these MOSTs relative to the well voltages. Here, $V_T$ are the values defined using a constant current (1 nA/μm). In the NMOST, if $V_T$ has a positive sign, the NMOST assumes an enhancement mode. Accordingly, the NMOST is switched OFF more deeply as $V_T$ becomes larger. If $V_T$ has a negative sign, the NMOST assumes a depletion mode. Consequently, the current will flow even if the gate voltage is equal to 0 V, and a larger driving current can be flown as absolute value of $V_T$ becomes larger. In the PMOST, the polarity becomes inverted to that of the NMOST. The threshold voltages $V_T$ are measured in compliance with ordinary conditions, and $V_T$ of the NMOST measured when the well voltage is set at 0 V is equal to 0.2 V, and $V_T$ of the PMOST measured when the well voltage is set at $V_{DD}$ is also equal to substantially 0.2 V. The converter CNV converts a pulse, which is inputted into an input terminal IN and whose amplitude is equal to $V_{DD}$, into a same-polarity pulse which is provided with a larger amplitude ranging from $V_{BB}$ to $V_{DH}$. Then, the converter CNV applies this same-polarity and larger-amplitude pulse to the wells of $M_{p1}$ and $M_{N1}$. On account of this, between the threshold voltages $V_T$ of $M_{p1}$ and $M_{N1}$, one voltage becomes larger and the other voltage becomes smaller, and vise versa. For example, setting $V_{DD}$=0.5 V, $V_{BB}$=−0.5 V, and $V_{DH}$=1 V, assume that a pulse which will change from 0 V to 0.5 V is inputted. Since the well voltage of the NMOST is made larger and becomes equal to $V_{DH}$, $V_T$ changes to a point d in the drawing where $V_T$ is smaller. At this point, the NMOST changes into a depletion mode where $V_T$=−0.2 V. Accordingly, the NMOST finds it possible to drive (i.e., discharge) load capacity of an output terminal OUT at high speed and with a large current. At this time, the PMOST is switched OFF. This is because, since the well voltage of the PMOST also becomes equal to $V_{DH}$, its $V_T$ changes to a point d' in the drawing, and thus the PMOST changes into an enhancement mode where $V_T$ is larger. On the other hand, if the input pulse changes from $V_{DD}$ to 0 V, the output of the converter changes from $V_{DH}$ to $V_{BB}$. Accordingly, the NMOST changes from the point d to a point c, thus changing into an enhancement mode where $V_T$ is substantially equal to 0.3 V. The PMOST transitions from the point d' to a point c', thus changing into a depletion mode where $V_T$ is substantially equal to 0.1 V. Consequently, this time, the PMOST will drive (i.e., charge) the load capacity of the output terminal OUT at high speed and with a large current that the PMOST has generated.

As is obvious from the above-described explanation, whenever the input is changed, either of the NMOST and the PMOST becomes conductive, and the other is maintained at the high $V_T$ (e.g., 0.2 V or more) at which the sub-threshold current is tolerable. This configuration allows implementation of a completely novel circuit, i.e., the dynamic-mode enhancement/depletion CMOS inverter where, depending on the input, the threshold voltages $V_T$ dynamically change between the enhancement mode and the depletion mode. Unlike the conventional CMOS inverter illustrated in FIG. 13B, this effect results from making the well voltage amplitudes of the in-inverter MOSTs larger than the gate input-voltage amplitude of the in-inverter MOSTS, or making the well voltage amplitudes of the in-inverter MOSTs larger than the drain voltage amplitudes or source voltage amplitudes of the in-inverter MOSTS. Incidentally, as is publicly known, $V_{DH}$ and $V_{BB}$ can be generated based on the power-supply voltage $V_{DD}$ and using a charge-pump circuit, for example.

Hereinafter, in order to clarify differences in the effect between the CMOS inverter according to the present invention and a conventional CMOS inverter (FIG. 13B), the more detailed explanation will be given below.

In the process where the input waveform is changing from 0 to $V_{DD}$, the threshold voltages $V_T$ of the MOSTs change dynamically with the intervention of the converter CNV. Now, take the NMOST ($M_{N1}$) as the example. Here, conversion ratio of the input voltage ($V_{IN}$) into the well voltage ($V_{well}$) is denoted by $k_1$, and change ratio of $V_T$ in response to the change in the well voltage is denoted by $k_2$. Also, assume that $V_T$ at the time when the input voltage is equal to 0 V, i.e., $V_T$(0), is equal to 0.2 V (corresponding to the point a in the drawing). This value is large enough to make the sub-threshold current tolerable. When the input voltage changes from 0 V to $V_{IN}$, $V_T$ of the NMOST becomes equal to $V_T$(0) $-k_2 V_{well}$. If, at this time, the NMOST is switched ON, the following expressions hold:

$$V_{well} = k_1 V_{IN}$$

$$V_{IN} = V_T(0) - k_2 V_{well}$$

$$\therefore V_{IN} = V_T(0)/(1+k_1 k_2). \qquad (1)$$

Accordingly, the input voltage at which the NMOST starts to be switched ON becomes smaller by the amount of coefficient $(1+k_1 k_2)$. Actually, this very input voltage, which is none other than $V_T$ of the NMOST generated as the result of the dynamic change, indicates that the input voltage has become smaller.

Figure 13A:
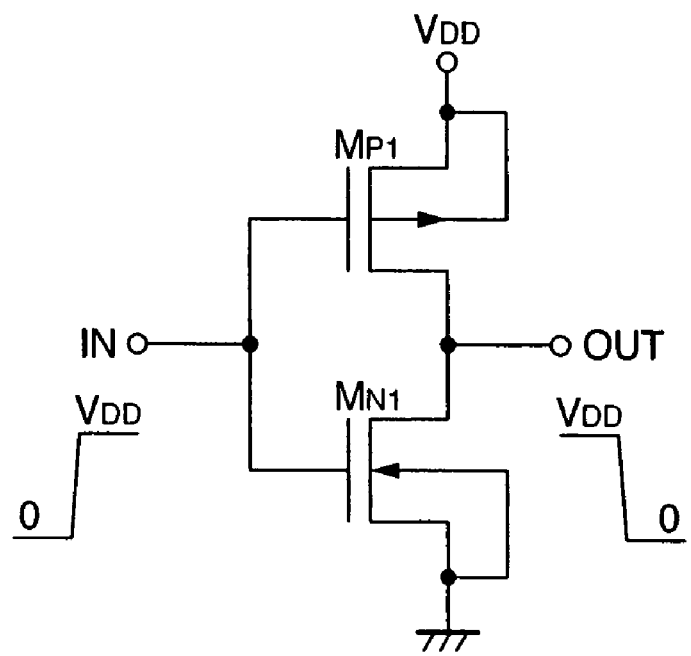
FIG. 13A and FIG. 13B illustrate a conventional CMOS inverter.
Figure 13B:
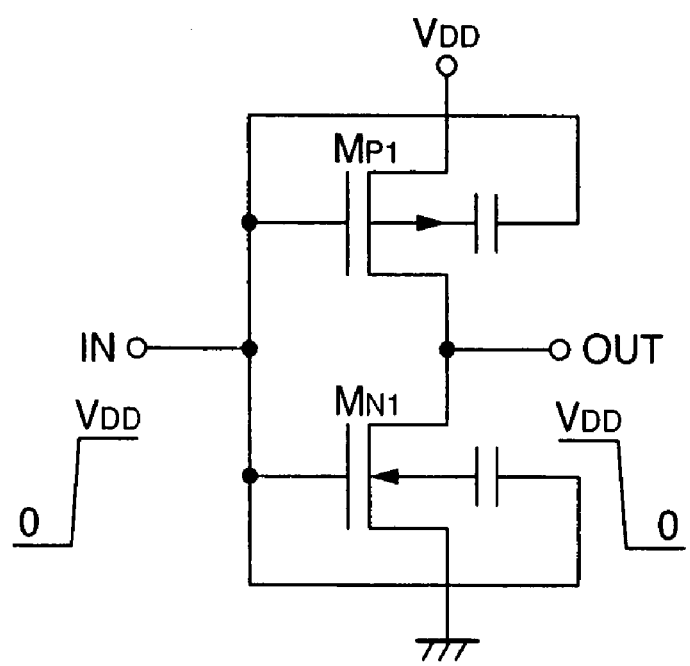

Then, using this expression, with respect to the input voltage at which the NMOST starts to be switched ON, let's make the comparison among the following cases: Namely, the case where the well voltage is fixed as is illustrated in FIG. 13A, the case where the gate and the well are directly connected to each other as is illustrated in FIG. 13B, and the case where, by the converter, the input voltage is converted into a larger voltage, and this larger voltage is applied to the well as is illustrated in FIG. 1. In the case where the well voltage is fixed, $V_{IN}$=0.2 V holds since $k_1$=0 and $k_2$=0 are established, and thus $V_T$ remains static and unchanged. In the case where the gate and the well are directly connected to each other, $k_1$=1 holds. Also, $k_2$=0.4 is established on average. This is because, when focusing attention on the relation ranging from the point a to the point d, $V_T$ changes by 0.4 V as the well voltage changes by 1 V. Accordingly, from the expression (1), the NMOST starts to be switched ON at $V_{IN}$=0.14 V. In the case of the converter scheme, $k_1$=2 is established since $V_{DD}$ (=0.5 V) is converted into $V_{DH}$ (=1 V). Consequently, from the expression (1), the NMOST starts to be switched ON at $V_{IN}$=0.11 V. Here, in the application to mobile appliances or the like where requirements for the leakage current are severe, $V_T(0)$=0.5 V holds. In this case as well, the input voltage at which the NMOST starts to be switched ON can be determined from the expression (1) in basically the same way. Namely, the NMOST is permitted to operate at the input voltages of the following ascending order, i.e., 0.28 V in the converter intervention scheme, 0.36 V in the gate-well direct connection scheme, and 0.5 V in the well-voltage fixed scheme.

Obviously, it is preferable that the change ratio $k_2$ of $V_T$ relative to the well voltage be larger in order to enhance the effect of the dynamic $V_T$ like this.

Incidentally, the following setting is preferable in order to change the NMOST into the depletion mode thereby to enhance the dynamic $V_T$ effect:

$$V_T(0) - k_2 V_{well=VT}(0) - k_1 k_2 V_{IN} < 0. \quad (2)$$

Consequently, a circuit scheme which will make $k_1$ larger is of first importance. Implementation of this circuit scheme requires that the well-voltage amplitude be made as large as possible. The embodiment in FIG. 1 satisfies this very requirement. Alternatively, in the case of the circuit in FIG. 13B, using larger input voltage, i.e., larger $V_{DD}$, is effective. A MOST structure which will make $k_2$ larger is of another importance. Implementation of this MOST structure requires that the thickness of the BOX layer be made thinner to enhance functionality of the under-BOX MOST. Making the thickness too thin, however, causes tunnel current to occur. Accordingly, an order of 2 nm in silicon-dioxide film thickness is its limit. Here, in addition to the silicon-dioxide film of 2-nm-thick order, films such as oxynitride (SiON) film are also preferable. This is because the gate-film interface maintains stability even at a high-temperature processing temperature needed after formation of the BOX layer. In this case, the BOX layer can be made thin down to an order of 1.5 nm in equivalent silicon-dioxide thickness. The operation and effect explained so far are also basically the same in the case of the PMOST.

Figure 10A:
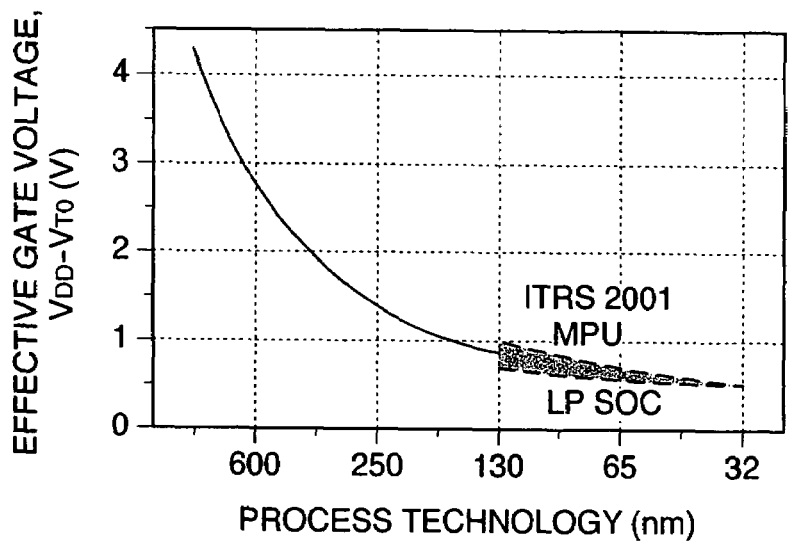
FIG. 10A and FIG. 10B illustrate the lowering trend of the effective gate voltage, and the comparison in the variations (90 nm, 65 nm, 45 nm, and 32 nm denote the device sizes) in the threshold voltage between the conventional bulk CMOS transistor (bulk at the upper stage) and the conventional FD-SOI MOS transistor (FD-SOI at the lower stage) used in the present invention, respectively.
Figure 10B:
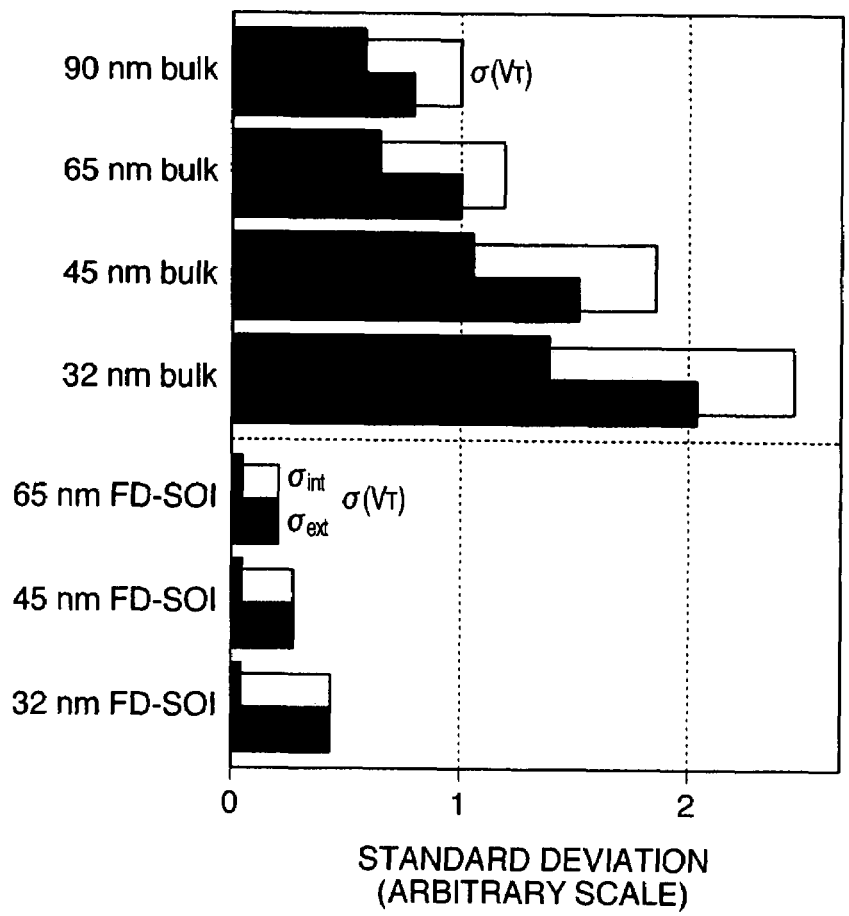

In the dynamic-$V_T$ scheme, after the MOSTs start to be switched ON in the process where the input waveform is starting up, the threshold voltages $V_T$ of the MOSTs are gradually becoming smaller in accompaniment with the increase in the input voltage. As a result, by the amount equivalent thereto, influence of the $V_T$ variation exerted on the driving current, i.e., the influence of the $V_T$ variation exerted on the operation-speed variation, becomes relatively smaller as compared with the fixed $V_T$. Consequently, the dual effects implemented by the FD-SOI MOST, i.e., the $V_T$-variation reduction effect implemented by the FD-SOI MOST itself indicated in FIG. 10B and the $V_T$-variation reduction effect implemented by the dynamic-$V_T$ circuit scheme, make it possible to neglect the influence of the $V_T$ variation exerted on the operation-speed variation.

In the embodiment in FIG. 1, if the second circuit (converter CNV) is highly-sensitive and highly-speedy enough to detect an infinitesimal change in the input voltage, inputting even an extremely low $V_{DD}$ enables the first circuit (inverter INV) to be operated at high speed. For example, as explained earlier, in the application to mobile appliances or the like where $V_T(0)$=0.5 V is requested, the minimum voltage which permits the MOSTs within the first circuit to operate is equal to 0.5 V in the well-voltage fixed scheme, 0.36 V in the gate-well direct connection scheme, and 0.28 V in the converter scheme. This shows that, even if $V_{DD}$ has lowered down to an order of 3 V, the converter scheme permits the operation although the other two schemes do not permit the operation. This is because the converter scheme lowers $V_T$, and thus allows implementation of the high sensitivity. Accordingly, high-sensitivity design for the converter becomes important. Incidentally, in addition to the above-described voltage settings, combination of $V_{BB}$=0 and $V_{DH}$>$V_{DD}$, or combination of $V_{DH}$=$V_{DD}$ and $V_{BB}$<0 (namely, $V_{BB}$ is negative) is possible depending on conveniences for the design.

Figure 3:
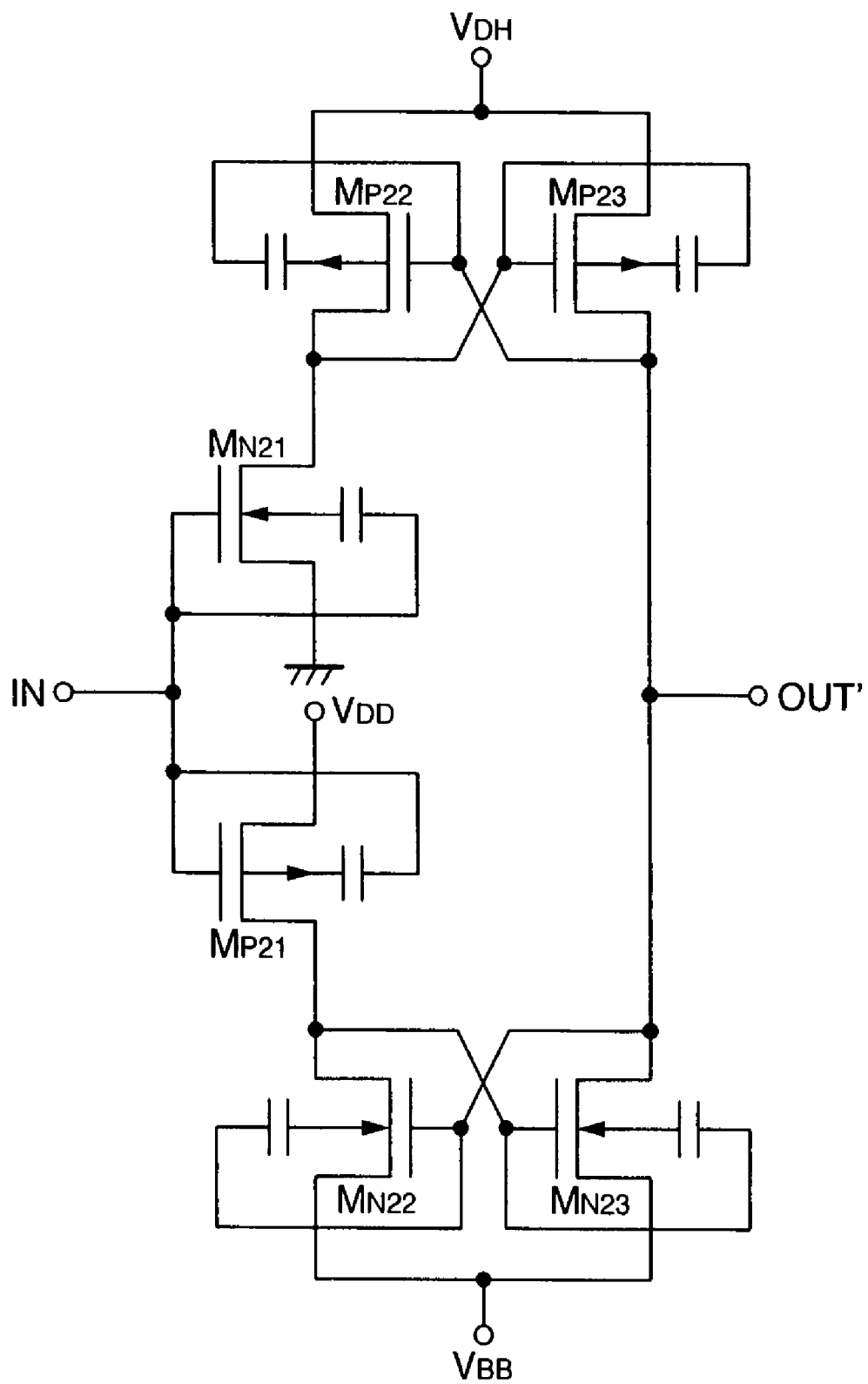
FIG. 3 is a schematic diagram of a voltage converter.

FIG. 3 illustrates a concrete example of the high-sensitivity and high-speed converter (CNV). In order to make smaller $V_T$ of input MOSTs (i.e., $M_{N21}$, $M_{P21}$) of the converter, circuits where the gates and the wells are directly connected to each other are employed thereby to allow implementation of the high sensitivity. Moreover, after the input voltage has been detected by these input MOSTs with the high sensitivity, the input voltage detected is converted into a larger voltage amplitude by feedback MOST circuits (i.e., $M_{P22}$, $M_{P23}$, $M_{N22}$, $M_{N23}$) which are characteristic of high-speed operations. In these circuits, since the gates and the wells are directly connected to each other as is the case with the conventional circuit in FIG. 13B, there exists the characteristic that the threshold voltages $V_T$ change dynamically. Unlike the conventional circuit, however, the wells and circuits of $M_{P22}$, $M_{P23}$, $M_{N22}$, and $M_{N23}$ are operated with larger voltage amplitudes which differ from voltage amplitude at the wells of the MOSTs ($M_{N21}$, $M_{P21}$) within the input circuit. As a result, variations in the threshold voltages $V_T$ of the feedback MOSTs are larger by the amount equivalent thereto. This results in an advantage that the feedback effect is made even larger. For example, if $M_{N21}$ is switched ON at the input voltage smaller than $V_{DD}$, gate voltage of $M_{P23}$ lowers, and thus an output OUT' starts to be charged up to $V_{DH}$. Since $M_{P22}$ is driven into the OFF state in accompaniment therewith, the gate voltage of $M_{P23}$ lowers even further. Eventually, the output will be charged to $V_{DH}$ at high speed by the tremendous feedback effect implemented by these larger voltage amplitudes. Of course, it is one of the causes for the high-speed implementation that capacities of the wells of these feedback MOSTs are smaller than the load capacity of the first circuit. On the other hand, if the input voltage changes from $V_{DD}$ to 0 V, $M_{N21}$ is switched OFF, and $M_{P21}$ is switched ON. Accordingly, the output will be discharged down to $V_{BB}$ at high speed in basically the same way.

Here, referring to FIG. 2 and focusing attention on the variations in the threshold voltages $V_T$, the more concrete explanation will be given below concerning the operation of the converter circuit in FIG. 3. In $M_{N21}$, $V_T$ changes in the range of the point a to the point b, and, in $M_{P21}$, $V_T$ changes in the range of the point a' to the point b'. Accordingly, the variations in $V_T$ are smaller by the amount of the smaller change in the gate input voltage. Meanwhile, in $M_{P22}$ and $M_{P23}$, $V_T$ change in the range of the point c' to the point d', and, in $M_{N22}$ and $M_{N23}$, $V_T$ change in the range of the point c to the point d. Consequently, the variations in $V_T$ are larger by the amount of the larger change in the gate input voltage, i.e., the voltage change made from $V_{DH}$ to $V_{BB}$. Obviously, as regards the values of $V_T$ at the OFF time, the input MOSTs ($M_{N21}$, $M_{P21}$) are smaller than the feedback MOST circuits ($M_{P22}$ and $M_{P23}$, $M_{N22}$ and $M_{N23}$) by the amount of the differences in the voltage amplitudes.

Embodiment 2

Figure 4A:
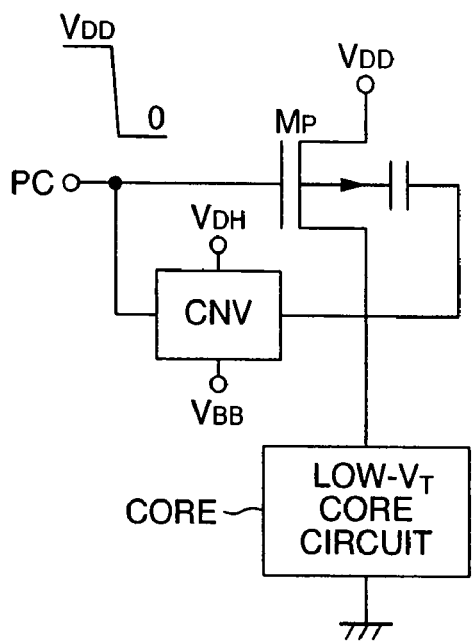
FIG. 4A, FIG. 4B, and FIG. 4C illustrate application embodiments of the present invention to power-supply switches, respectively.
Figure 4B:
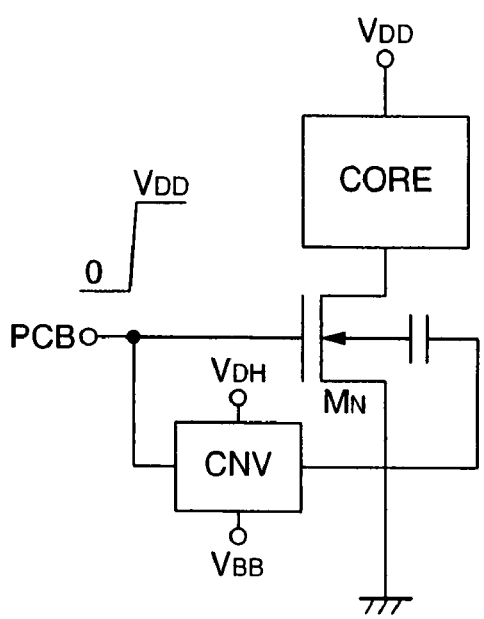
Figure 4C:
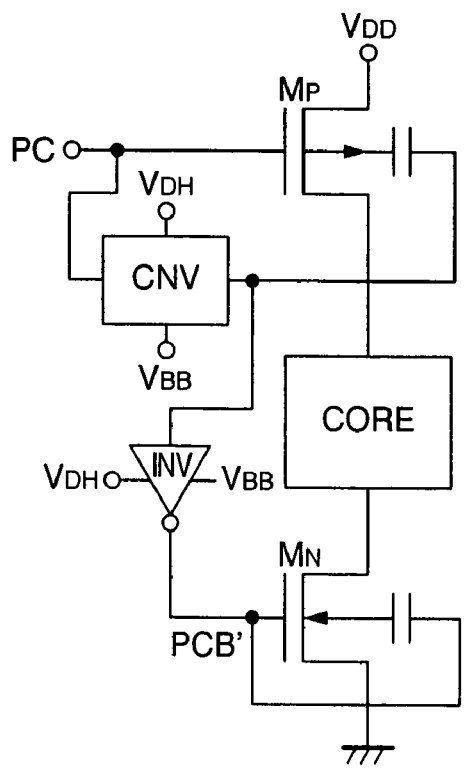

FIG. 4A, FIG. 4B, and FIG. 4C illustrate power-supply switches to which a MOST whose well is driven with a large voltage amplitude is applied, and which are then made small-sized. Here, a first circuit is a power-supply switch, and a second circuit is an internal core circuit (CORE). The operating voltage for the internal core circuit is small, and accordingly the threshold voltage $V_T$ of the MOST is also small. This results in flowing of a large sub-threshold current therein. FIG. 4A illustrates the following circuit: Using the PMOST ($M_p$), power-supply $V_{DD}$ for the internal core circuit is cut off from the internal core circuit during an unnecessary time-zone, thereby cutting the sub-threshold current in the internal core circuit. During the unnecessary time-zone, e.g., a time-period such as standby time or sleep mode, switching the PMOST completely OFF requires that $V_T$ of the PMOST be made larger. On the other hand, during a time-zone in which the internal core circuit operates, feeding an enough ON-current to the internal core circuit requires that $V_T$ of the PMOST be made small enough. This is because, otherwise (i.e., if $V_T$ were not made small enough), the existence of the switch PMOST would exert bad influences on the operation of the internal core circuit. In the present embodiment, unlike the conventional circuit in FIG. 13B, the characteristic is as follows: Namely, the well voltage amplitude of the switch MOST is made larger than the gate input-voltage amplitude of the switch MOST, or the well voltage amplitude of the switch MOST is made larger than the drain voltage amplitude or source voltage amplitude of the switch MOST.

In a microprocessor chip or the like, in order to feed the enough current to the internal core circuit, channel width of the switch PMOST attains to 3 m or more. This, in the conventional switch MOST, increases the gate capacity as well as the area. Consequently, there exists a danger of making it difficult to design a circuit for controlling the gate voltage. If $V_T$ at the ON time of the MOST is made smaller, the current feeding capability will be enhanced. The threshold voltages $V_T$, however, is the value which is always fixed. This condition makes $V_T$ at the OFF time smaller as well, thereby making it impossible to shield the MOST. As a result, the sub-threshold current in the MOST becomes a problem. In the present embodiment, however, $V_T$ of the MOST can be made larger at the OFF time. Accordingly, it becomes possible to shield the MOST completely. Also, $V_T$ of the MOST can be made smaller at the ON time. Consequently, it becomes possible to feed the enough current to the internal core circuit even if the channel width of the MOST is narrower. Since the internal core circuit generally occupies a large area, an area increase by the converter CNV is negligible. FIG. 4B illustrates an embodiment where the NMOST ($M_N$) is used as the switch MOST. This embodiment is expected to exhibit basically the same effect. FIG. 4C illustrates an embodiment where the switches are used on both of the power-supply side and the ground side. If the output from the converter CNV is inverted by an inverter and is applied to $M_N$, setting up only one converter will suffice.

Embodiment 3

Figure 5A:
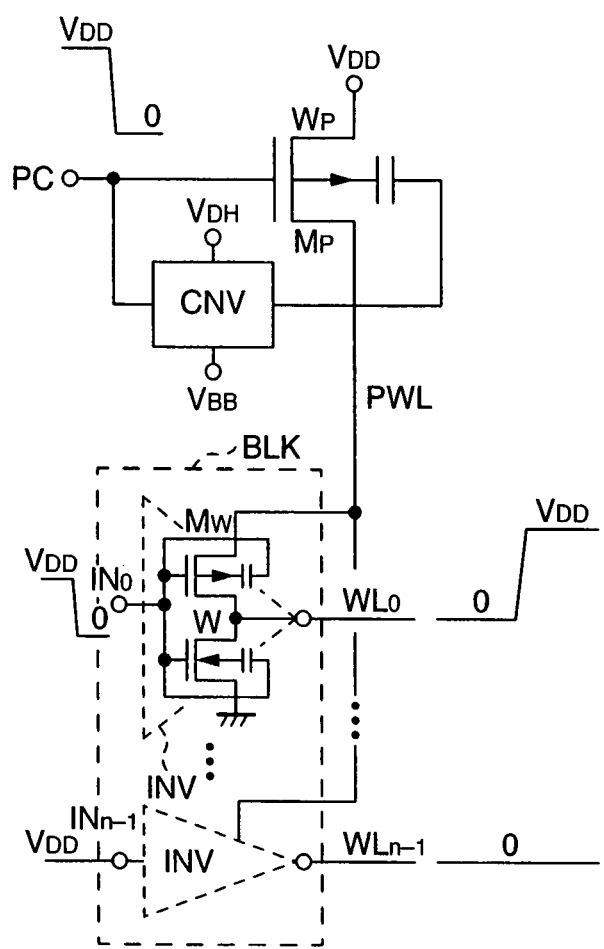
FIG. 5A and FIG. 5B illustrate application embodiments of the present invention to a repetition-circuit block, respectively.
Figure 5B:
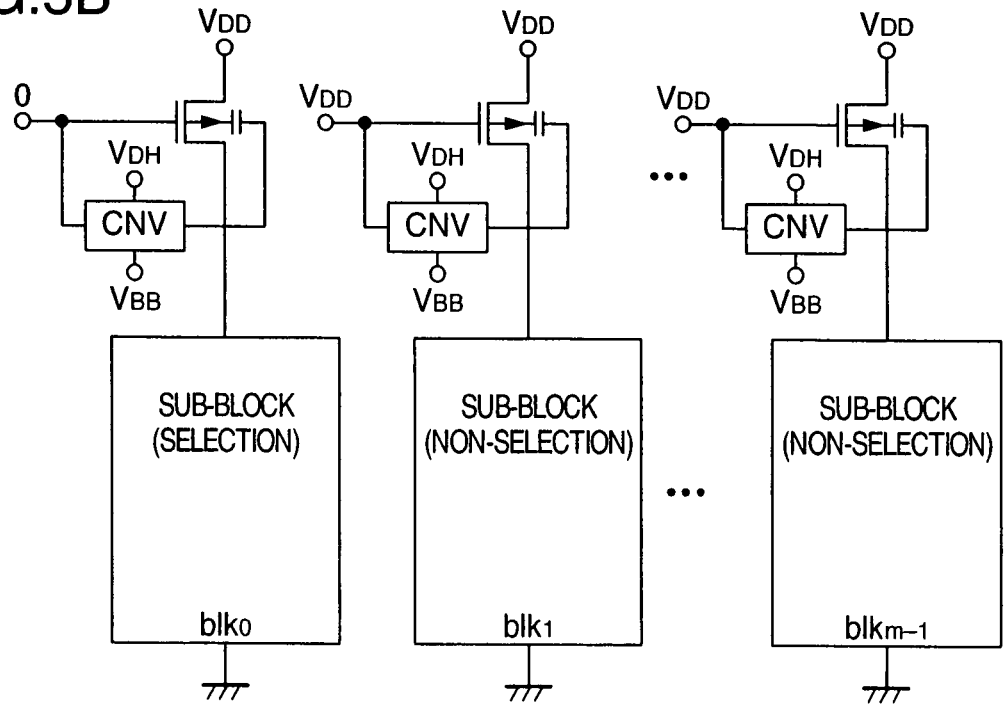

FIG. 5A illustrates an embodiment where the present invention is applied to a MOST switch (i.e., first circuit) and a repetition-circuit block (BLK) (i.e., second circuit). Here, this repetition-circuit block is, e.g., a word-driver block of memory. Each MOST included therein is the FD-SOI MOST. The respective sources of output PMOSTs ($M_W$) of inverters are collectively connected to a single common source line PWL. Moreover, the PWL is connected to power-supply voltage $V_{DD}$ via the switch MOST ($M_p$). At the time of selection for an inverter, the switch MOST ($M_p$) is switched ON, and the input voltage into one inverter INV out of the n inverters within the block BLK is made equal to 0 V. This operation selects the one inverter INV, thus selecting and driving the corresponding one word line from among n word lines (i.e., $WL_0, \ldots, WL_{n-1}$). On the other hand, at the time of the non-selection, the gate voltage of $M_p$ is made equal to $V_{DD}$ to switch $M_p$ OFF. Also, the input voltages into all the inverters are made equal to $V_{DD}$ to switch all the inverters OFF. Here, the switch MOST ($M_p$) is added to the block BLK in order to reduce a sub-threshold current which will flow in the output PMOSTs ($M_W$) within the block BLK. By the way, the following fact has been well known: Namely, for simplicity, assuming that the threshold voltages $V_T$ of all the MOSTs are equal to each other at the time of the non-selection, the sub-threshold current will be reduced down to $W_p/nW$ by the switch MOST ($M_p$). Here, $W_p$ and W denote channel width of the switch MOST ($M_p$) and that of the output PMOSTs ($M_W$) of the inverters. Here, considering the above-described condition at the time of the selection shows that a certain relationship holds between $W_p$ and W. Namely, at the time of the selection, the switch MOST ($M_p$) is switched ON, and only one inverter within the BLK is driven. As a result, as long as both of them (i.e., $M_p$ and the output-stage PMOST within the only one inverter) have the equal $V_T$, selecting $W_p$ as being of an order of 10 W allows the corresponding word line to be driven with the driving speed scarcely dropped even if the switch MOST is added. Accordingly, at the time of the non-selection, the sub-threshold current will be reduced down to an order of 10/n. As a result, the larger n is, i.e., the larger the number of the word lines is, the more the sub-threshold current will be reduced. Here, at the time of the selection, the use of the converter allows $V_T$ of the switch MOST to be made small enough or, as described earlier, permits the switch MOST to change into the depletion mode. This makes it possible to make $W_p$ small enough down to 10W or less, which corresponds to the amount equivalent to the driving current capable of being taken then. Consequently, the switch MOST can be made small-sized. FIG. 5B illustrates another embodiment. Here, the following fact has been well known: Namely, one block is divided into a large number of sub-blocks, then selecting a sub-block which is wished to be selected. This allows implementation of the low power consumption when seen as a whole. The present embodiment results from adding, to the respective sub-blocks, the switch in FIG. 5A which is equipped with the selection function. Only a switch MOST corresponding to a sub-block wished to be selected is switched ON. As compared with the embodiment in FIG. 5A, size of each switch MOST can be made smaller by the amount equivalent to the implementation of the division. Accordingly, well capacity of each switch MOST can be made smaller. Consequently, it is effective enough to select and drive a single switch MOST alone which has the small capacity like this. This allows implementation of the low power consumption.

Figure 6A:
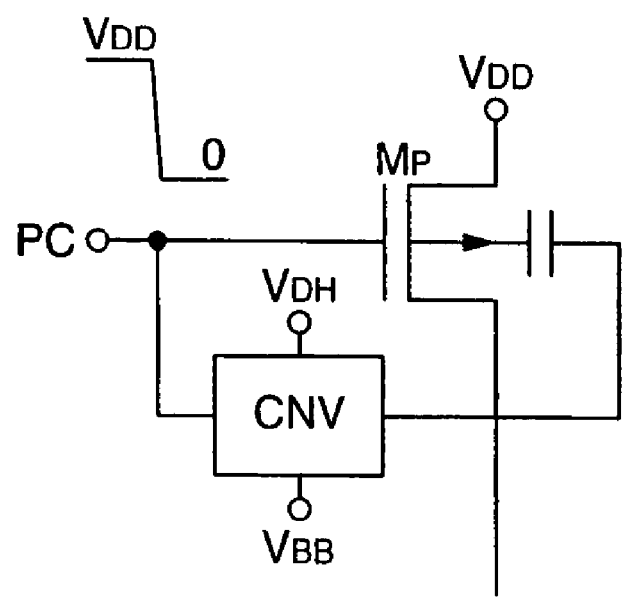
FIG. 6A and FIG. 6B illustrate embodiments of power-supply switches of the present invention, respectively.
Figure 6B:
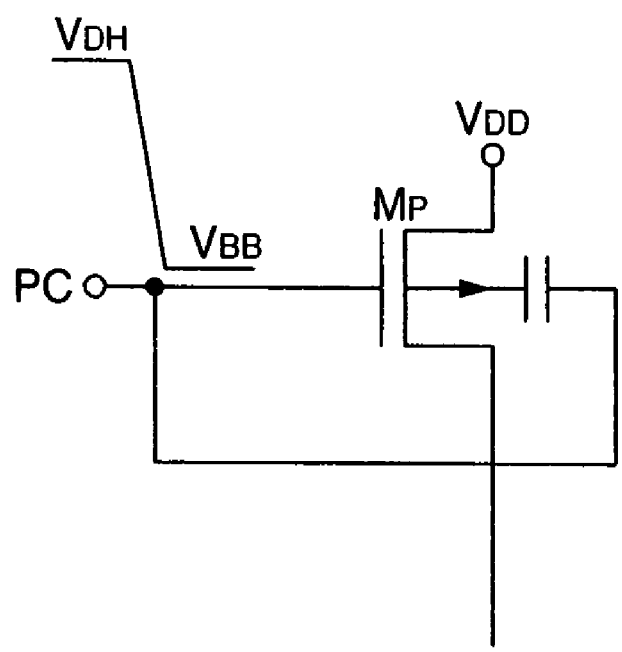

Incidentally, the embodiments illustrated in FIG. 4A, FIG. 4B, FIG. 4C, FIG. 5A, and FIG. 5B are the ones where the power-supply switch illustrated in FIG. 6A is used. Also, as illustrated in FIG. 6B, a power-supply switch is also usable where the gate and the well are directly connected to each other, and where a pulse whose amplitude is made equal to $V_{DH}$ and $V_{BB}$ is applied to this gate. The implementation of this large amplitude makes it possible to make the change in $V_T$ larger. Also, as will be explained in FIG. 8, when performing in-batch driving of a large number of switch MOSTs simultaneously, the converter CNV for driving each MOST can be omitted. This allows implementation of the smaller area as a whole.

Embodiment 4

Figure 7A:
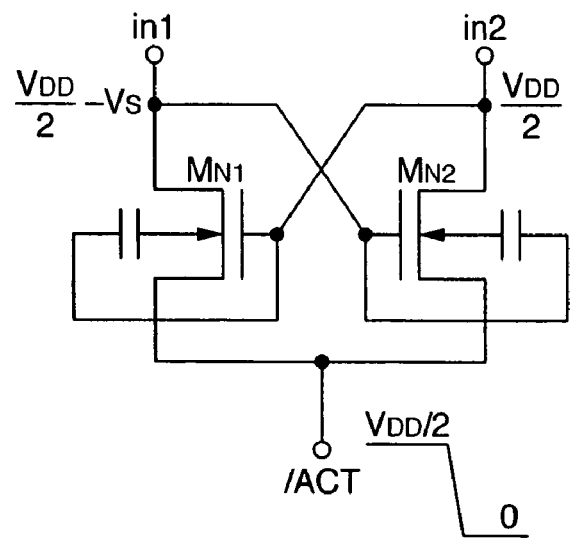
FIG. 7A and FIG. 7B illustrate differential amplifiers to which the present invention is applied, respectively.
Figure 7B:
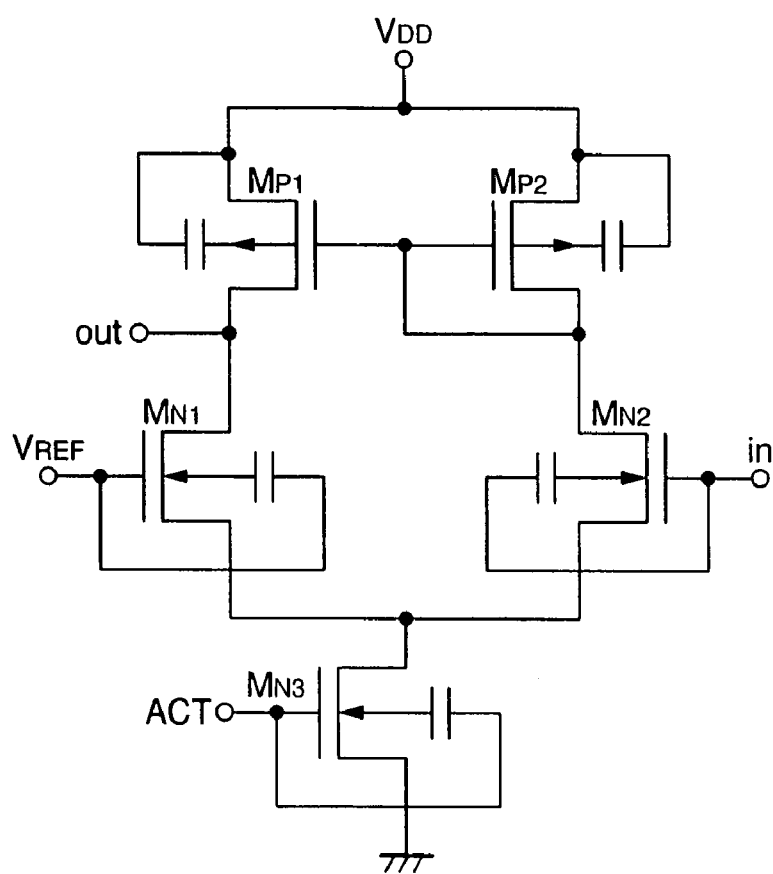

The inventor et al. have noticed for the first time that the conventional circuit in FIG. 13B, depending on its application, will exhibit an amplification effect. FIG. 7A and FIG. 7B illustrate amplifiers which result from taking advantage of this amplification effect exhibited by the conventional circuit. FIG. 7A illustrates a latch sense amplifier used in such devices as a DRAM (: Dynamic Random-Access Memory). Here, the gates and the wells are directly connected to each other. This makes the input voltage effectively larger; that is to say, the amplification effect exists effectively. For example, take the following case as an example: One (in1) of inputs is equal to $V_{DD}/2-V_s$, which results from superimposing a signal voltage $v_s$ on a floating voltage $V_{DD}/2$, and the other input (in2) is equal to the floating voltage $V_{DD}/2$. Accordingly, well voltages of the NMOSTs (i.e., $M_{N1}$ and $M_{N2}$) are also equal to $V_{DD}/2$ and $V_{DD}/2-v_s$, respectively. As is apparent from the drawing, $V_T$ of $M_{N2}$ becomes larger by $\delta V_T$ by the negative signal voltage $v_s$. Namely, by the amount of $\delta V_T$, $M_{N2}$ finds it more difficult to be switched ON. Conversely, by this amount of $\delta V_T$, $M_{N1}$ finds it easier to be switched ON. This is because the signal voltage becomes effectively larger by the amount of $\delta V_T$. Consequently, if an activation pulse is inputted into a common terminal/ACT, $M_{N1}$ becomes easier to be conductive, and thus the input (in1) will be discharged down to 0 V at high speed. In this process, $M_{N2}$ is becoming more and more difficult to be conductive, and thus the input (in2) will stop to be discharged at a certain constant voltage. FIG. 7B illustrates a well-known current-mirror amplifier frequently used in such devices as a SRAM. This current-mirror amplifier also effectively exhibits the amplification effect in basically the same way. Here, $V_{REF}$ denotes reference voltage.

Figure 8:
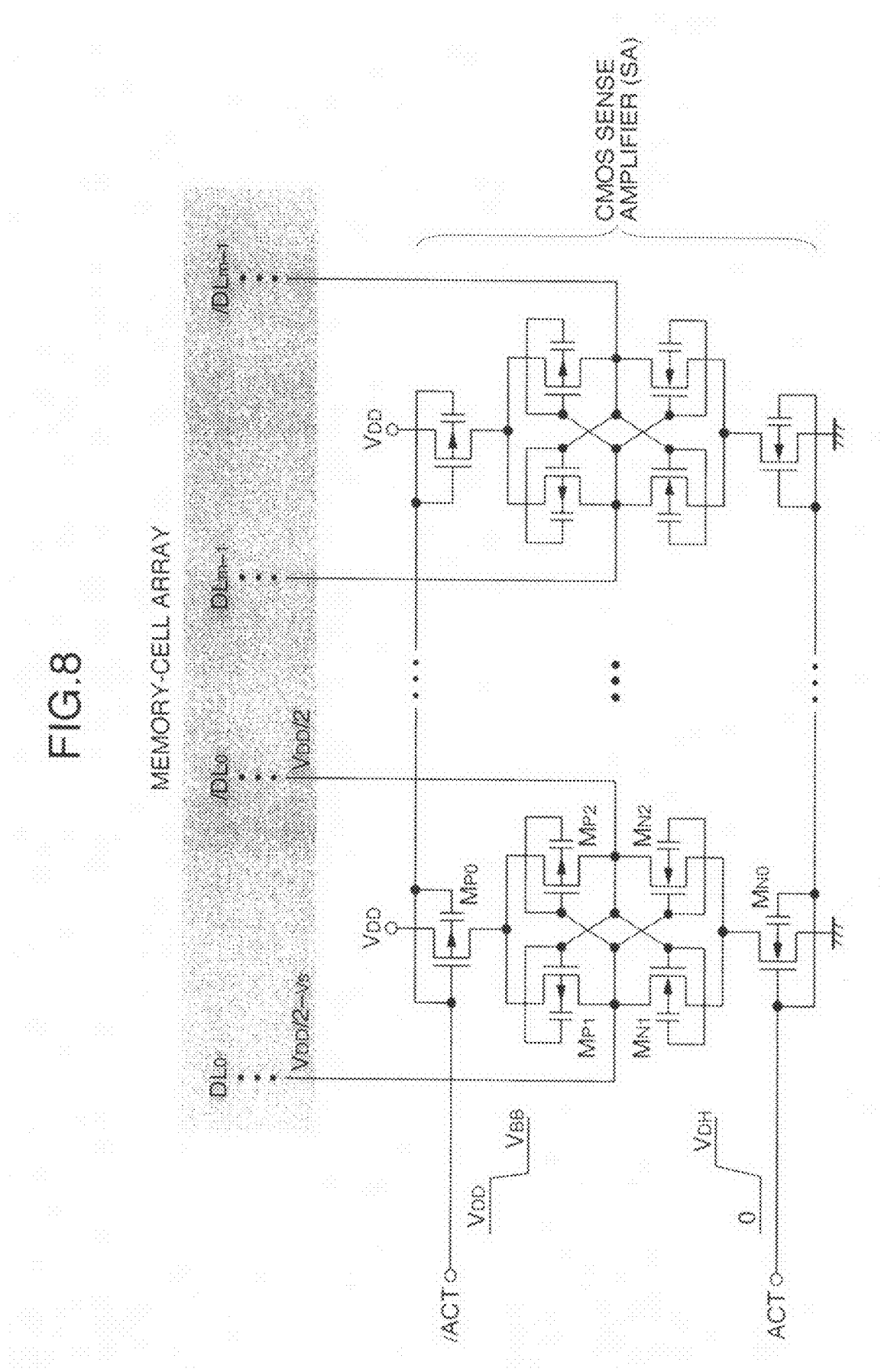
FIG. 8 illustrates an application embodiment of the present invention to a DRAM sense system.

FIG. 8 illustrates a DRAM sense system where NMOST version of the power-supply switch illustrated in FIG. 6B and the amplifier illustrated in FIG. 7A are combined with each other. As is well known, if a certain memory cell (not shown in the drawing) within the memory-cell array is read out, for example, a negative signal voltage $v_s$ will be outputted to one of the data pair-lines (e.g., $DL_0$ and $/DL_0$) which are precharged at the voltage $V_{DD}/2$. Usually, this signal voltage is equal to an order of 100 mV, which is considerably small. Accordingly, this signal voltage is amplified up to $V_{DD}$ by using a latch CMOS sense amplifier (: SA) where the well-known cross-connected NMOS amplifier and PMOS amplifier as illustrated in FIG. 7A are longitudinally accumulated. Switching the driving MOSTs (i.e., $M_{ND}$ and $M_{PD}$) ON allows the amplification to be started. Usually, however, the amplification is performed at first using the NMOS amplifier by switching $M_{ND}$ ON, and after that, the amplification is subsequently performed using the PMOS amplifier by switching $M_{PD}$ ON. As a result, the data line ($/DL_0$ in the drawing) which is charged at the larger initial voltage will be charged up to $V_{DD}$, while the data line ($DL_0$) which is charged at the smaller initial voltage will be discharged down to 0 V. More concretely, since the gates and wells of the MOSTs configuring the amplifiers are directly connected to each other, as explained earlier, the signal will be effectively amplified. Namely, the threshold voltage $V_T$ Of $M_{N2}$ becomes larger. Accordingly, if $M_{ND}$ is switched ON, the data line $DL_0$ starts to be discharged toward 0 V. After that, if $M_{PD}$ is switched ON, $V_T$ of $M_{P2}$ becomes smaller since $DL_0$ is being discharged. Consequently, $M_{P2}$ will charge the data line $/DL_0$ even further. This accelerates the discharge of the data line $DL_0$ by $M_{N21}$, thereby eventually making $DL_0$ become equal to 0 V, and making $/DL_0$ become equal to $V_{DD}$. Also, the driving MOSTs are driven with the large voltage amplitudes. As a consequence, $V_T$ at the time of the operation can be made small enough with $V_T$ at the time of the non-operation being maintained at constant large values. This, at the time of the operation, allows the amplifiers to be driven at high speed.

Embodiment 5

Figure 9:
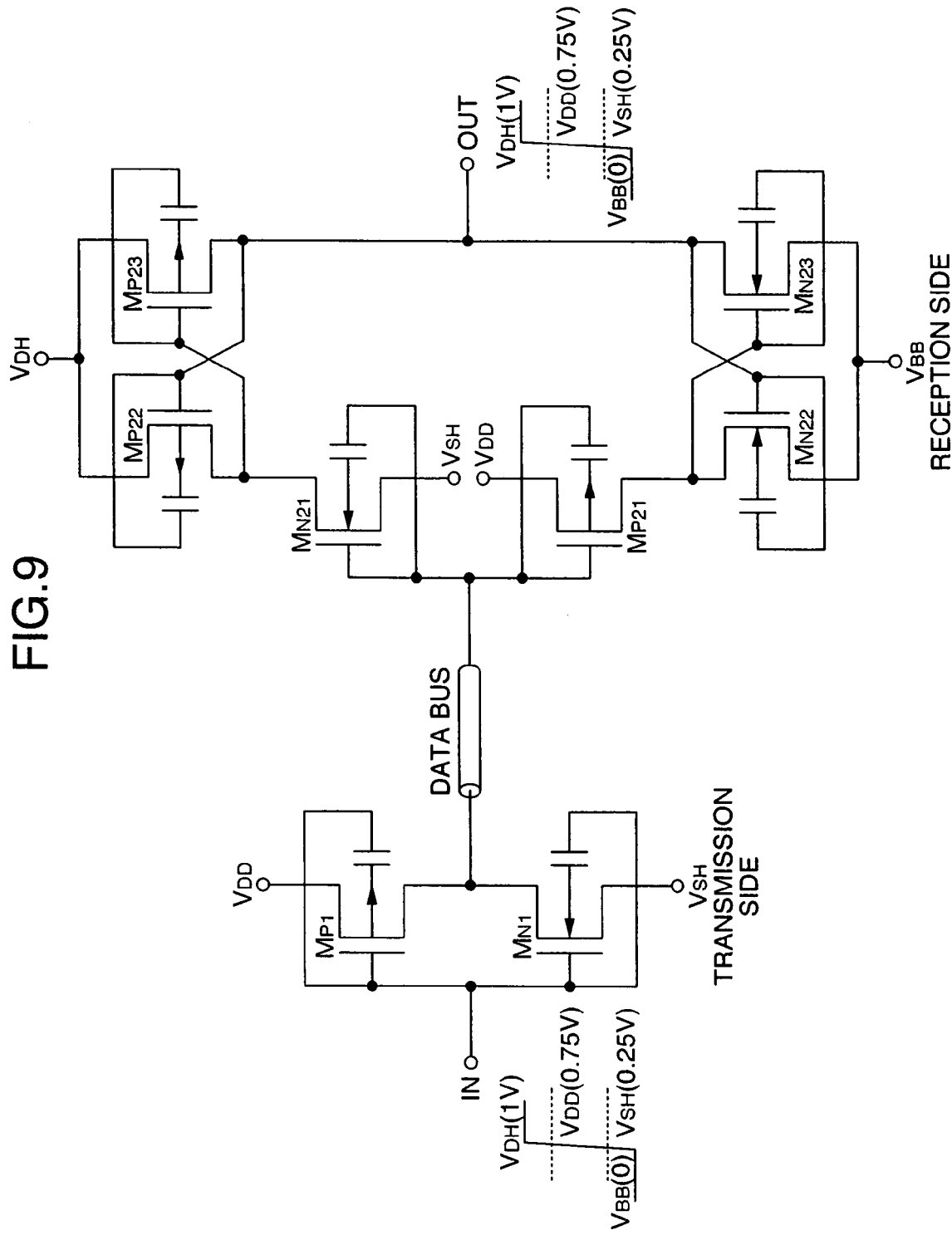
FIG. 9 illustrates an embodiment of the CMOS inverter of the present invention and a level conversion circuit.

FIG. 9 illustrates a CMOS inverter which takes advantage of circuits where the gates and the wells are directly connected to each other. Namely, the present embodiment is a one which allows an extraordinarily large load capacity of device, such as data bus inside a chip, to be driven with low power consumption and at high speed. As is well known, when driving a large load capacity, driving the large load capacity at a low voltage is advantageous from the point-of-view of the low power consumption. In an ordinary CMOS, however, this method results in a lowering in the operation speed. In the embodiment in this drawing, the internal main circuits are driven with an amplitude of 1 V ranging from $V_{DH}$ (1V) to $V_{BB}$ (0V). Also, the internal large bus capacity is driven with an amplitude of 0.5 V ranging from $V_{DD}$ (0.75 V) to $V_{SH}$ (0.25 V). The in-inverter MOSTs on the transmission side inside the chip are driven with the large logic amplitude. As a result, even if the gates and the wells are directly connected to each other, the changes in $V_T$ are significantly large. This, consequently, allows the bus to be driven with the amplitude of 1 V and at high speed. Meanwhile, on the reception side inside the chip, the level conversion into the same logic amplitude as the one of the input on the transmission side is performed at high speed and in accordance with basically the same operation as the one explained in FIG. 3. Here, $V_{DD}$ and $V_{SH}$ are set between $V_{DH}$ and $V_{BB}$. Although the relative relationship among these voltages is the same as the one explained in FIG. 1, $V_{BB}$ in this embodiment is set not at the negative voltage but at the ground level. The reason for this is as follows: Namely, generating the negative voltage inside the chip necessitates the use of a charge-pump circuit, but the charge-pump circuit lacks in its current driving capability. This situation makes it difficult to drive the large load capacity such as the data bus with the use of $V_{BB}$ which is at the stable level. Incidentally, in this embodiment, although the direct connection between the gates and the wells is the same as in the conventional circuit, there exist the following differences: Namely, the well voltage amplitudes are larger than the drain voltage amplitudes or source voltage amplitudes. Otherwise, the well voltage amplitudes of the in-first-circuit MOSTs on the transmission side are different from the well voltage amplitudes on the reception side.

Incidentally, in the double-gate MOST structure used in the embodiments so far, the input signal is inputted into the gate of the upper MOST, and the threshold voltage $V_T$ of the entire MOST is controlled using the control voltage inputted into the well in the lower MOST. These functions can also be made reverse. Namely, a circuit scheme is also possible where the input signal is inputted into the well, and where the control voltage for $V_T$ is inputted into the gate of the upper MOST.

According to the above-described embodiments, it becomes possible to provide the semiconductor device whose low-voltage implementation, low power-consumption implementation, high-speed implementation, or small-size implementation has been accomplished.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device, comprising:
   a MOS transistor having silicon-on-insulator structure, said silicon-on-insulator structure including double gates and a fully-depleted silicon-on-insulator layer, said double gates being a first gate and a second gate, said second gate being a well layer which exists under a buried oxide film, wherein,
   said first gate of said MOS transistor is driven with a first pulse, said second gate of said MOS transistor is driven with a second pulse, and a voltage amplitude of said second pulse is larger than a voltage amplitude of said first pulse.

2. A semiconductor device according to claim 1, further comprising: a power-supply switch for a block including repetition circuits, wherein said power supply switch is said MOS transistor.

3. A semiconductor device according to claim 1, further comprising: a power-supply switch which is connected to each of a plurality of sub-blocks and is selectively activated, wherein the power supply switch is said MOS transistor.

4. A semiconductor device according to claim 1, wherein said voltage amplitude of said second pulse is larger than a voltage amplitude of a drain or a source of said MOS transistor.

5. A semiconductor device according to claim 4, wherein in said MOS transistor, said first gate and said second gate are connected to each other through a circuit outputting said second pulse.

6. A semiconductor device according to claim 4, further comprising: a power-supply switch for a block including repetition circuits, wherein said power supply switch is said MOS transistor.

7. A semiconductor device according to claim 4, further comprising: a power-supply switch which is connected to each of a plurality of sub-blocks and is selectively activated, wherein said power supply switch is said MOS transistor.

* * * * *